United States Patent
Ho et al.

(10) Patent No.: US 6,737,720 B2
(45) Date of Patent: May 18, 2004

(54) PACKAGING STRUCTURE OF IMAGE SENSOR AND METHOD FOR PACKAGING THE SAME

(76) Inventors: Mon Nan Ho, No. 84, Taiho Road, Chupei, Hsinchu Hsien (TW); Hsiu Wen Tu, No. 84, Taiho Road, Chupei, Hsinchu Hsien (TW); Ching Shui Cheng, No. 84, Taiho Road, Chupei, Hsinchu Hsien (TW); Li Huan Chen, No. 84, Taiho Road, Chupei, Hsinchu Hsien (TW); Joe Liu, No. 84, Taiho Road, Chupei, Hsinchu Hsien (TW); Jichen Wu, No. 84, Taiho Road, Chupei, Hsinchu Hsien (TW); Wen Chuan Chen, No. 84, Taiho Road, Chupei, Hsinchu Hsien (TW)

( * ) Notice: Subject to any disclaimer, the term of this patent is extended or adjusted under 35 U.S.C. 154(b) by 40 days.

(21) Appl. No.: 09/768,845

(22) Filed: Jan. 23, 2001

(65) Prior Publication Data

US 2002/0096758 A1 Jul. 25, 2002

(51) Int. Cl.7 .......................................... H01L 31/0203
(52) U.S. Cl. ....................... 257/433; 257/432; 257/434; 257/704; 438/64; 438/125
(58) Field of Search ................................ 257/432–434, 257/704, 784, 702, 701; 438/64, 125, 48, 45

(56) References Cited

U.S. PATENT DOCUMENTS

| | | | | |
|---|---|---|---|---|
| 5,200,362 A | * | 4/1993 | Lin et al. | 29/841 |
| 5,436,492 A | * | 7/1995 | Yamanaka | 257/433 |
| 5,950,074 A | * | 9/1999 | Glenn et al. | 438/118 |
| 6,262,479 B1 | * | 7/2001 | Chou | 257/704 |
| 6,262,579 B1 | * | 7/2001 | Chazan et al. | 324/537 |
| 6,384,472 B1 | * | 5/2002 | Huang | 257/676 |

* cited by examiner

Primary Examiner—David Talbott
Assistant Examiner—Luan Thai
(74) Attorney, Agent, or Firm—Pro-Techtor International Services

(57) ABSTRACT

A packaging structure of an image sensor includes a substrate, an image sensing chip, a plurality of wirings, and a transparent layer. The substrate includes a plurality of metal sheets, glue for sealing the metal sheets, a first surface, and a second surface. The metal sheets are exposed to the outside via the first surface and the second surface to form first contacts and second contacts, respectively. The image sensing chip is mounted on the substrate. The plurality of bonding pads are formed on the image sensing chip. The plurality of wirings electrically connect the bonding pads on the image sensing chip to the first contacts of the first surface of the substrate, in order to electrically connect the image sensing chip to the substrate. The transparent layer is arranged above the image sensing chip. Therefore, a packaging structure of an image sensor made of plastic materials can be formed, thereby simplifying the packaging processes and lowering the manufacturing costs.

11 Claims, 2 Drawing Sheets

PACKAGING STRUCTURE OF IMAGE SENSOR AND METHOD FOR PACKAGING THE SAME

BACKGROUND OF THE INVENTION

1. Field of the Invention

The invention relates to a packaging structure of image sensors and method for packaging the same, and in particular, to a packaging structure in which a substrate for carrying an image sensing chip is formed using plastic materials and the substrate includes metallic pins, thereby lowering the manufacturing costs.

2. Description of the Related Art

In typical image sensors, in order to achieve the demands for high heat dissipating efficiency and high sealing property, the substrate for carrying the image sensing chip is formed from ceramic materials. A plurality of ⊏-shaped pins connected to each other are formed on the top and bottom surfaces of the substrate extending from the periphery thereof. The image sensing chip is placed on the substrate. Then, the image sensing chip is electrically connected to the pins on the top surface of the substrate by a plurality of wirings. Next, a transparent glass is used to cover the image sensing chip to complete the package of the image sensor. Thus, the pins on the bottom surface of the substrate can be electrically connected to the circuit board in the image sensor after packaging.

In the substrate of the image sensor including ceramic materials, it should be noted that both the selection of the components of the ceramic materials and the control of the working temperature are very important in manufacturing processes. If an improper selection or control is made, the substrate may be easily deformed or cracked. Furthermore, since the ceramic substrate cannot be easily cut without any crack, it must be made individually. Therefore, a lot of ceramic substrates cannot be manufactured at the same time, causing the manufacturing costs relatively high.

Moreover, since the pins on the bottom surface of the substrate are used for electrically connecting to the circuit board, the pins have to form a flat contact surface in order not to influence the electrical connection relationship between the substrate and the circuit board. However, the prior art pins are formed into "⊏" shapes on the top and bottom surfaces by pressing. As a result, it is not easy to form a plurality of flat pins, thereby influencing the signal transmission in the image sensor.

In addition, the signal transmission distances for the ⊏-shaped pins are relatively long. Therefore, the signal transmission between the image sensing chip and the substrate is also influenced.

In order to solve the above problems, it is necessary to provide a packaging structure and method for an image sensor in which the manufacturing costs can be lowered and the signal transmission of the image sensing chip can be improved.

SUMMARY OF THE INVENTION

It is therefore an object of the invention to provide a packaging structure and method for an image sensor which can be manufactured in large quantities to lower the manufacturing costs.

Another object of the invention is to provide a packaging structure and method for an image sensor in which the signal transmission distances can be made shorter to perform better signal transmission properties.

To achieve the above objects, a packaging structure of an image sensor includes a substrate, an image sensing chip, a plurality of wirings, and a transparent layer. The substrate includes a plurality of metal sheets, glue for sealing the metal sheets, a first surface, and a second surface. The metal sheets are exposed to the outside via the first surface and the second surface to form first contacts and second contacts, respectively. The image sensing chip is mounted on the substrate. The plurality of bonding pads are formed on the image sensing chip. The plurality of wirings electrically connect the bonding pads of the image sensing chip to the first contacts of the first surface of the substrate, in order to electrically connect the image sensing chip to the substrate. The transparent layer is arranged above the image sensing chip.

Therefore, the second contacts formed on the metal sheets can electrically and smoothly connect to the circuit board. Furthermore, the signal transmission distances between the image sensing chip and the circuit board can be effectively shortened so as to obtain better signal transmission effects. Moreover, since the substrate formed by sealing the metal sheets with the glue can be easily cut, a lot of substrates can be manufactured at the same time by molding so that the manufacturing costs can be lowered.

DETAIL DESCRIPTION OF THE INVENTION

Figure 1:
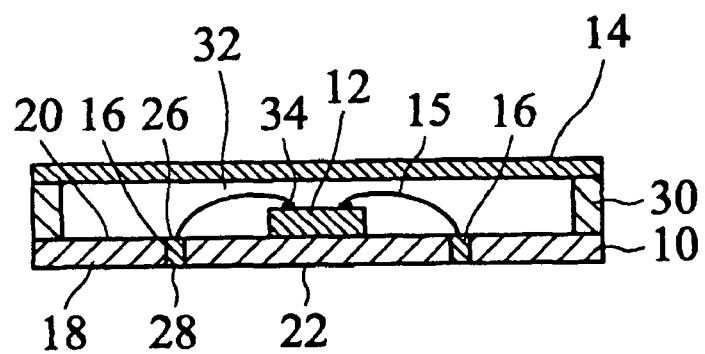
FIG. 1 is a cross-sectional view showing the packaging structure of the image sensor according to the invention.

Referring to FIG. 1, the packaging structure of the image sensor of the invention includes a substrate 10 made of plastic materials, an image sensing chip 12 located on the substrate 10 and electrically connected thereto, and a transparent layer 14 above the image sensing chip 12. The image sensing chip 12 receives optical signals via the transparent layer 14.

Figure 2:
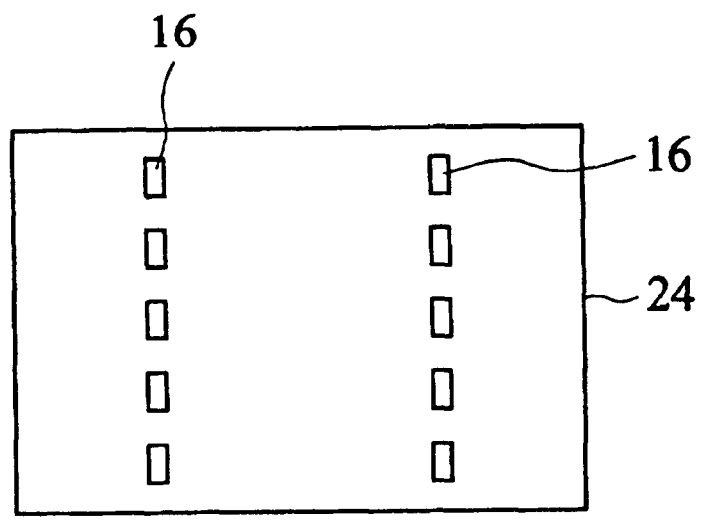
FIG. 2 is a first schematic illustration showing the packaging method of the image sensor according to the invention.
Figure 3:
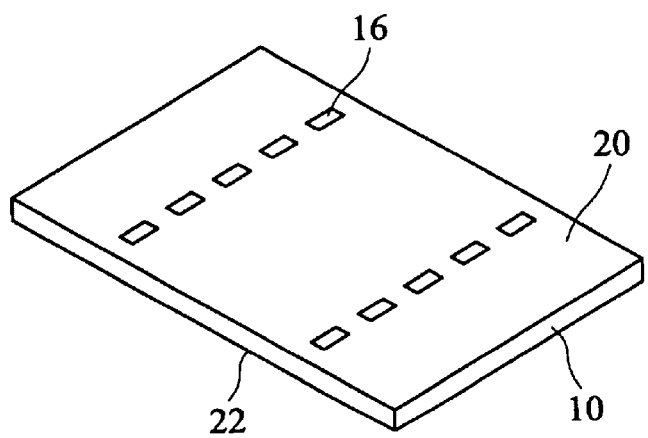
FIG. 3 is a pictorial view showing the substrate of the image sensor according to the invention.

The substrate 10 includes a plurality of straight metal sheets 16 directly penetrating through the substrate, glue 18 for sealing the metal sheets 16, a first surface 20, and a second surface 22. Referring to FIG. 2, the method for manufacturing the substrate 10 includes the following steps. First, adhere the plurality of metal sheets 16 onto a tape 24. Next, place the tape 24 on a mold (not shown). Then, pour the glue into the mold, the glue can be a plastic material such as epoxy mold compound, BT, FR4, FR5, PPE, or the like. Thereafter, tear the tape 24 to complete the manufacturing processes of the substrate 10, as shown in FIG. 3. At this time, the metal sheets 16 are exposed to the outside via both of the first surface 20 and the second surface 22 of the substrate 10, respectively, in order to form first contacts 26 and second contacts 28 on the substrate 10. Alternatively, a projecting edge 30 is formed around the first surface 20 of the substrate 10 in order to form a concavity 32 for containing the image sensing chip 12. The projecting edge 30 can be integrally formed with the substrate 10. Optionally, the projecting edge 30 also can be made of plastic materials, and then, the projecting edge 30 is adhered onto the substrate 10. Thus, the transparent layer 14 can be placed on the projecting edge 30 in order to seal the image sensing chip 12 which can receive optical signals.

The image sensing chip 12 is adhered within the concavity 32 of the first surface 20 of the substrate 10. A plurality of bonding pads 34 are provided on the image sensing chip 12 for electrically connecting to the substrate 10 through a plurality of wirings 15. The bonding pads 34 on the image sensing chip 12 are electrically connected to the first contacts 26 on the first surface 20 of the substrate 10 through the plurality of wirings 15 by way of wiring bonding, respectively. Thus, the image sensing chip 12 is electrically connected to the first contacts 26 on the first surface 20 of the substrate 10, thereby enabling the electrical signals from the image sensing chip 12 to be transmitted to the second contacts 28 of the second surface 22 of the substrate 10. As a result, the substrate 10 can be electrically connected to the circuit board (not shown) via the second contacts 28. Since the metal sheets 16 are very thin, the transmission distances between the first contacts 26 and the second contacts 28 are very short. Consequently, the signals from the image sensing chip 12 can be effectively transmitted to the second contacts 28. Furthermore, since the image sensing chip 12 is quite flat and thin, the image sensing chip 12 is capable of effectively and electrically contacting to the circuit board (not shown), when mounting the substrate 10 onto the circuit board.

The transparent layer 14 can be a piece of transparent glass mounted on the projecting edge 30 on the first surface 20 of the substrate 10 for covering the image sensing chip 12. Therefore, the image sensing chip 12 is capable of receiving the optical signals in order to form an image sensor.

Figure 4:
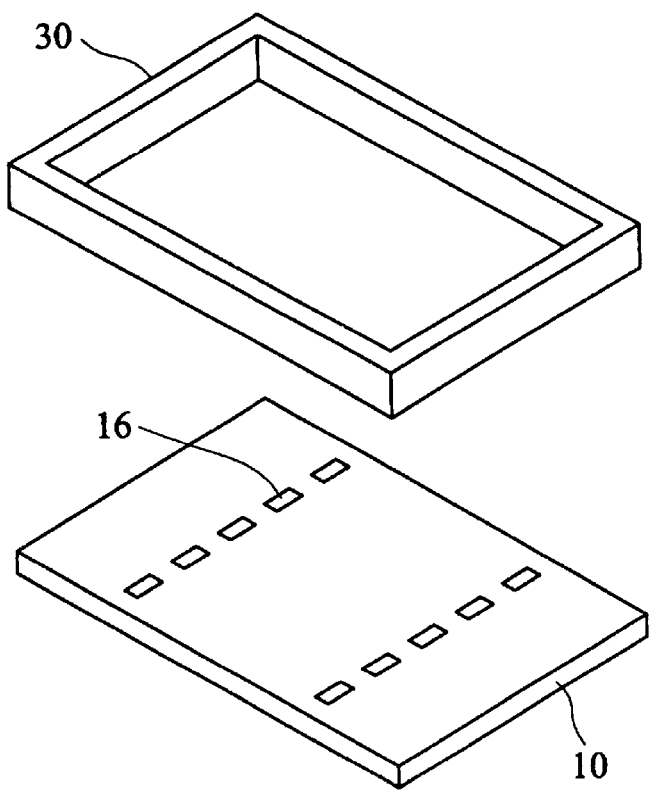
FIG. 4 is a second schematic illustration showing the packaging method of the image sensor according to the invention.

Referring to FIG. 4, the projecting edge 30 is adhered onto the substrate 10 in order to form a concavity 32 on the substrate 10 for containing the image sensing chip 12. The transparent layer 14 is adhered onto the projecting edge 30 for receiving optical signals from the image sensing chip 12.

To sum up, the method for packing the image sensor of the invention is described hereinbelow.

First, provide a substrate 10 including a plurality of metal sheets 16, glue 18 for sealing the metal sheets 16, a first surface 20, and a second surface 22. At this time, the metal sheets 16 are exposed to the outside via the first surface 20 and the second surface 22 to form first contacts 26 and second contacts 28.

Next, provide a projecting edge 30 on the first surface 20 of the substrate 10 to form a concavity 32 on the substrate 10 for containing the image sensing chip 12.

Then, place the image sensing chip 12 within the concavity 32 and connect the first contacts 26 of the substrate 10 to the bonding pads 34 on the image sensing chip 12, in order to electrically connect the image sensing chip 12 to the substrate 10. At this time, the signals from the image sensing chip 12 can be transmitted to the second contacts 28 of the substrate 10. Therefore, the second contacts 28 of the substrate 10 can electrically connect to the circuit board (not shown).

Thereafter, adhere the transparent layer 14 onto the projecting edge 30 located on the first surface 20 of the substrate 10. At this time, the transparent layer 14 covers the image sensing chip 12 so that the image sensing chip 12 can receive optical signals. Thus, an image sensor can be formed.

The packaging structure and method of the invention have the following advantages.

1. Since the signals from the image sensing chip 12 can be transmitted to the circuit board by the thin metal sheets 16 of the substrate 10, relatively short transmission distances and better signal transmission effects can be obtained.

2. Since the metal sheets 16 of the substrate 10 have smooth surfaces, better electric contacting effects between the substrate 10 and the circuit board can be obtained.

3. Since the plastic material of the substrate 10 can be easily cut, a large amount of substrates can be formed by molding. Then, the substrates can be cut into a plurality of single substrates. As a result, the substrates can be quickly made so that the manufacturing costs can be lowered.

4. Since the plastic material for forming the substrate 10 is cheaper than the ceramic material used in the prior art, the package costs also can be lowered.

While the invention has been described by way of example and in terms of a preferred embodiment, it is to be understood that the invention is not limited to the disclosed embodiment. To the contrary, it is intended to cover various modifications. Therefore, the scope of the appended claims should be accorded the broadest interpretation so as to encompass all such modifications.

What is claimed is:

1. A packaging structure of an image sensor, comprising:
   a substrate including a plurality of straight metal sheets directly penetrating through the subtrate, glue for sealing the metal sheets after the metal sheets are formed, a first surface having a periphery, and a second surface opposite to the first surface, the metal sheets being exposed to the outside via the first surface and the second surface to form first contacts and second contacts, respectively, wherein the glue surrounds the plurality of straight metal sheets;
   a projecting edge provided on the periphery of the first surface of the substrate to form a concavity above the substrate, the projecting edge being arranged on the glue;
   an image sensing chip mounted on the glue of the substrate and within the concavity, a plurality of bonding pads being formed on the image sensing chip;
   a plurality of wirings electrically and directly connecting the bonding pads of the image sensing chip to the first contacts of the first surface of the substrate in order to electrically connect the image sensing chip to the substrate, so that electrical signals from the image sensing chip are capable of being transmitted to the second contacts of the second surface of the substrate; and
   a transparent layer arranged on the projecting edge on the first surface of the substrate so that the image sensing chip is capable of receiving the optical signals.

2. The packaging structure of the image sensor according to claim 1, wherein the glue is selected from the group of plastic materials consisting of epoxy mold compound, BT, FR4, FR5, PPE, and the like.

3. The packaging structure of the image sensor according to claim 1, wherein the metal sheets are smooth.

4. The packaging structure of the image sensor according to claim 1, wherein the bonding pads on the image sensing chip are electrically connected to the first contacts of the substrate via the wirings by way of wire bonding.

5. The packaging structure of the image sensor according to claim 1, wherein the transparent layer is a piece of transparent glass.

6. A method for packing an image sensor, comprising the steps of:
   preparing a substrate including a plurality of straight metal sheets directly penetrating through the substrate, glue for sealing the metal sheets after the metal sheets are formed, a first surface having a periphery, and a second surface opposite to the first surface, the metal sheets being exposed to the outside via the first surface and the second surface to form first contacts and second contacts, respectively, wherein the glue surrounds the plurality of straight metal sheets.
   providing a projecting edge on the periphery of the first surface of the substrate to form a concavity above the substrate, the projecting edge being arranged on the glue;

mounting an image sensing chip having a plurality of bonding pads onto the the first surface and the glue substrate and within the concavity;

directly connecting the bonding pads of the image sensing chip to the first contacts of the first surface of the substrate by the plurality of wirings; and mounting a transparent layer on the projecting edge located on the first surface of the substrate in order to cover the image sensing chip.

7. The method for packaging the image sensor according to claim 6, further comprising the steps of:

adhering the metal sheets onto a tape;

sealing the metal sheets by the glue to form the substrate; and tearing the tape.

8. The method for packaging the image sensor according to claim 6, wherein the glue is selected from the group of plastic materials consisting of epoxy mold compound, BT, FR4, FR5, PPE, and the like.

9. The method for packaging the image sensor according to claim 6, wherein the bonding pads on the image sensing chip are electrically connected to the first contacts of the substrate via the wirings by way of wire bonding.

10. The method for packaging the image sensor according to claim 6, wherein the transparent layer is a piece of transparent glass.

11. The method for packaging the image sensor according to claim 6, wherein the projecting edge is adhered onto the first surface of the substrate.

* * * * *